(12) United States Patent
Dhuse et al.

(10) Patent No.: US 10,229,001 B2
(45) Date of Patent: Mar. 12, 2019

(54) ALLOCATING DATA BASED ON MEMORY DEVICE PERFORMANCE IN A DISPERSED STORAGE NETWORK

(71) Applicant: International Business Machines Corporation, Armonk, NY (US)

(72) Inventors: Greg R. Dhuse, Chicago, IL (US); Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 205 days.

(21) Appl. No.: 15/237,820

(22) Filed: Aug. 16, 2016

(65) Prior Publication Data

US 2017/0285980 A1    Oct. 5, 2017

Related U.S. Application Data

(60) Provisional application No. 62/314,839, filed on Mar. 29, 2016.

(51) Int. Cl.
*G06F 15/16* (2006.01)
*G06F 11/10* (2006.01)
(Continued)

(52) U.S. Cl.
CPC .......... *G06F 11/1076* (2013.01); *G06F 3/064* (2013.01); *G06F 3/0604* (2013.01);
(Continued)

(58) Field of Classification Search
CPC ...... G06F 3/0619; G06F 3/064; G06F 3/0644; G06F 3/0653; G06F 3/067; G06F 11/1076; H04L 67/1097
(Continued)

(56) References Cited

U.S. PATENT DOCUMENTS 4,092,732 A    5/1978    Ouchi
5,454,101 A    9/1995    Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Melvin H Pollack
(74) *Attorney, Agent, or Firm* — Garlick & Markison; Timothy W. Markison; Bruce E. Stuckman

(57) ABSTRACT

A method for execution by a dispersed storage and task (DST) processing unit includes generating a request for mapping parameters for transmission a storage unit in a dispersed storage network (DSN) and receiving mapping parameter data in response. Namespace mapping data is generated, indicating a mapping of possible slice names to a plurality of memory devices of the storage unit by performing a first deterministic mapping function based on the mapping parameter data. Slice name subset data is generated, indicating a subset of the possible slice names based on a health status indicators corresponding to the plurality of memory devices. A slice name corresponding to a first encoded slice of a first data object is selected from the subset indicated by the slice name subset data. A first write request that includes the first encoded slice is generated for transmission via the network to the storage unit.

20 Claims, 7 Drawing Sheets

(51) Int. Cl.
*G06F 3/06* (2006.01)
*H04L 29/08* (2006.01)
*G06F 11/36* (2006.01)
*G06F 11/16* (2006.01)
*H03M 13/15* (2006.01)
*H03M 13/00* (2006.01)

(52) U.S. Cl.
CPC ............ *G06F 3/067* (2013.01); *G06F 3/0619* (2013.01); *G06F 3/0631* (2013.01); *G06F 3/0644* (2013.01); *G06F 3/0647* (2013.01); *G06F 3/0653* (2013.01); *G06F 3/0659* (2013.01); *G06F 11/1092* (2013.01); *G06F 11/1662* (2013.01); *G06F 11/3684* (2013.01); *G06F 11/3688* (2013.01); *G06F 11/3692* (2013.01); *H03M 13/1515* (2013.01); *H03M 13/616* (2013.01); *H04L 67/1097* (2013.01); *G06F 2201/805* (2013.01); *G06F 2201/82* (2013.01)

(58) Field of Classification Search
USPC .......................................................... 709/224
See application file for complete search history.

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working—Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

(56) References Cited

OTHER PUBLICATIONS

Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

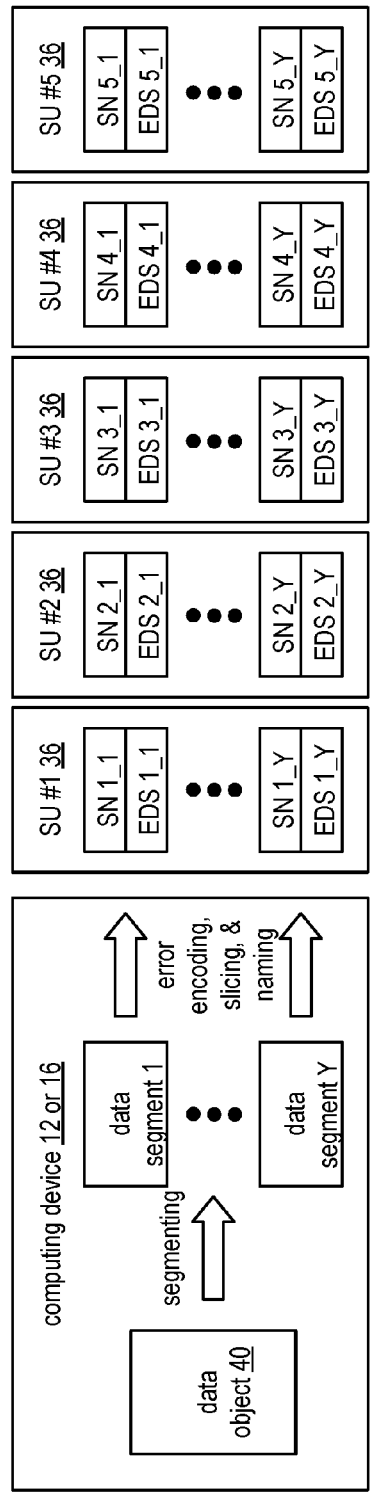
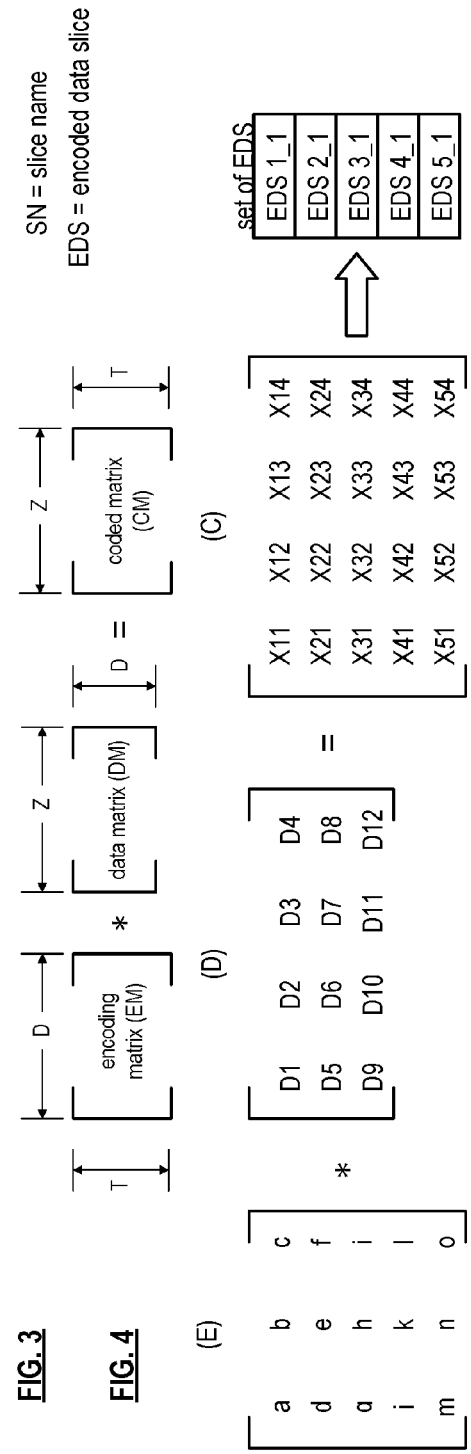
FIG. 3
FIG. 4
FIG. 5
FIG. 6

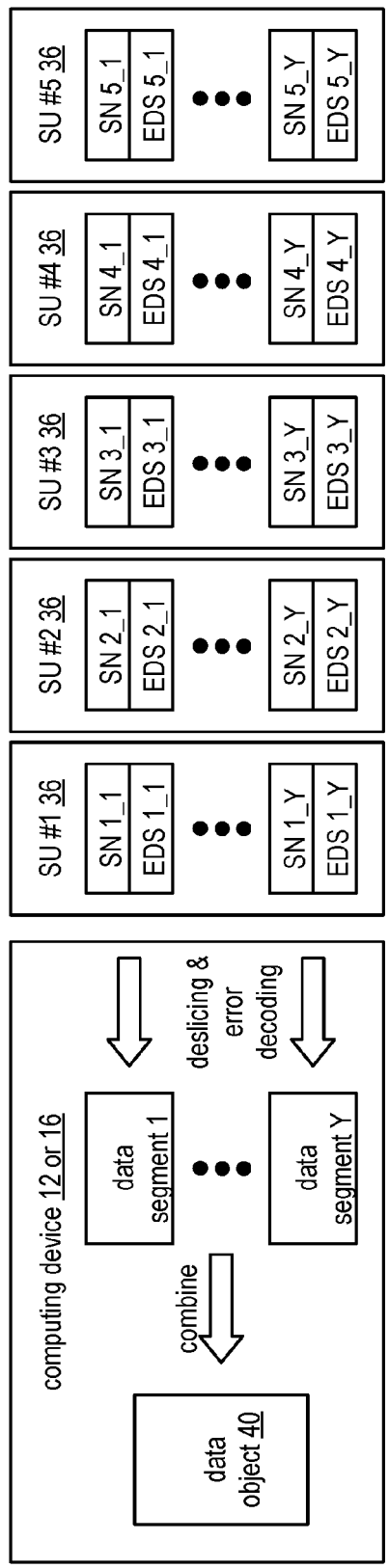

ALLOCATING DATA BASED ON MEMORY DEVICE PERFORMANCE IN A DISPERSED STORAGE NETWORK

CROSS-REFERENCE TO RELATED APPLICATIONS

The present U.S. Utility Patent Application claims priority pursuant to 35 U.S.C. § 119(e) to U.S. Provisional Application No. 62/314,839, entitled "PROCESSING AN ENCODED DATA SLICE IN A DISPERSED STORAGE NETWORK", filed Mar. 29, 2016, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 7 is a schematic block diagram of an example of dispersed storage error decoding of data in accordance with the present invention;

FIG. 8 is a schematic block diagram of a generic example of an error decoding function in accordance with the present invention;

DETAILED DESCRIPTION OF THE INVENTION

Figure 1:
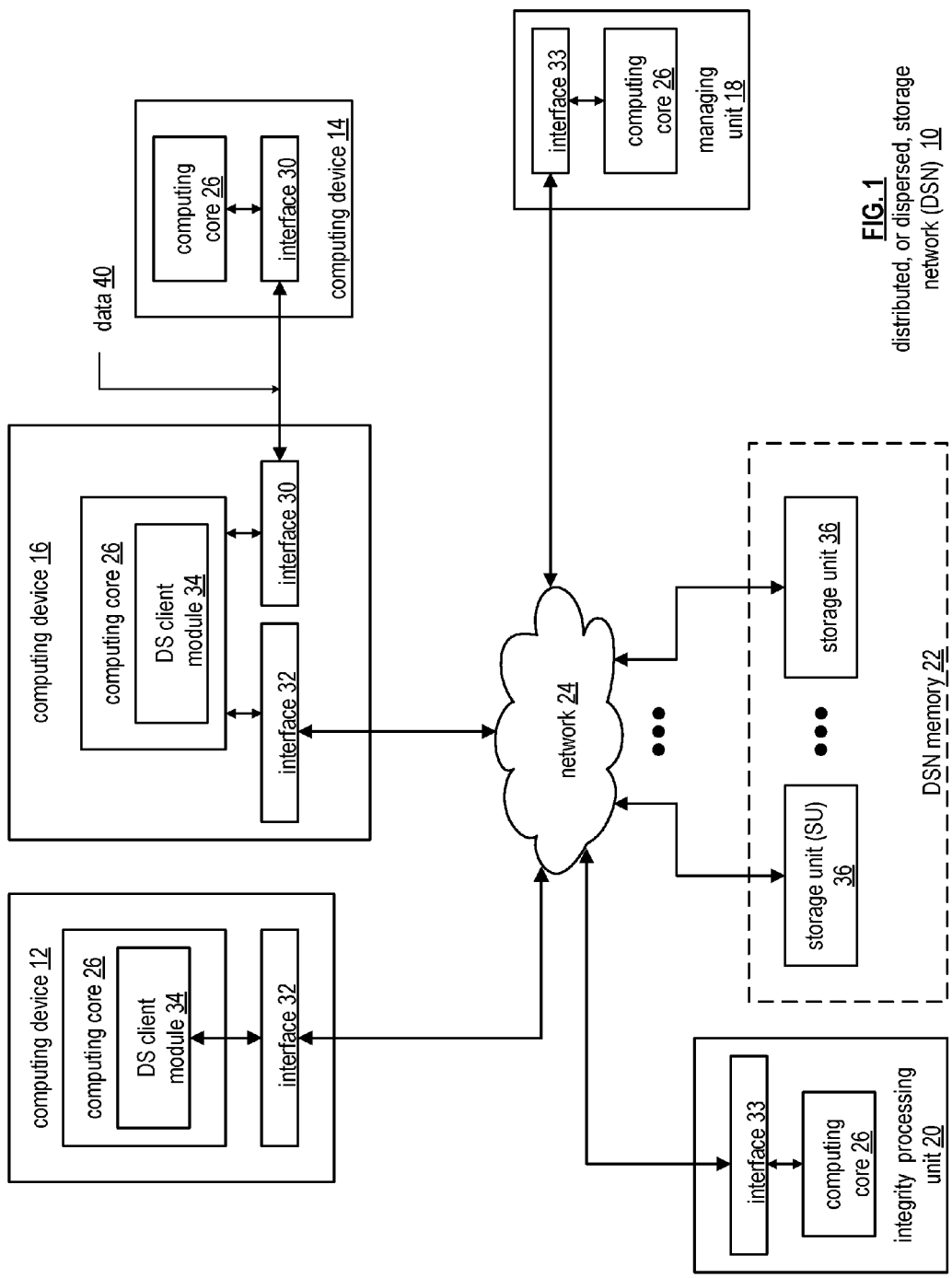
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
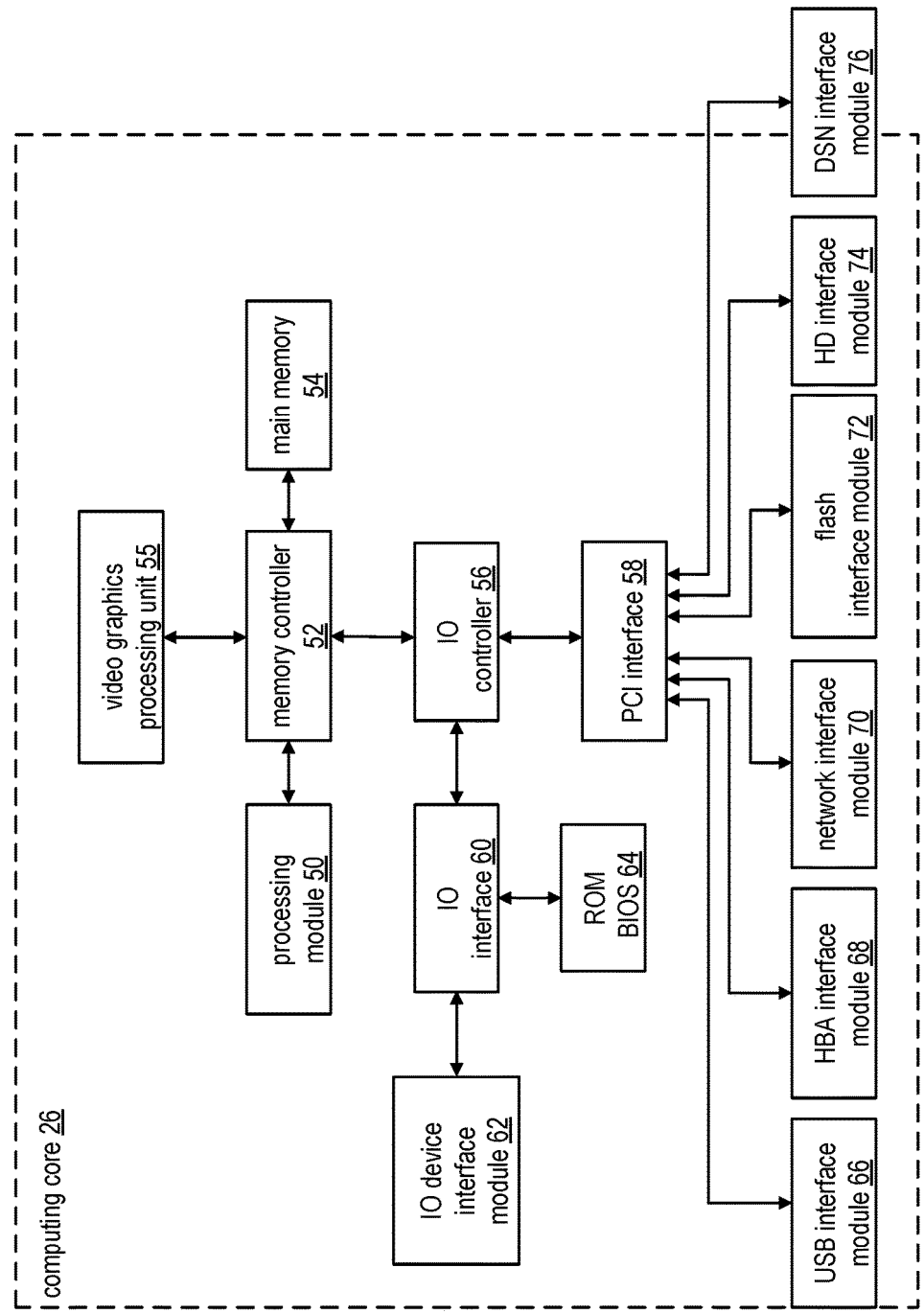
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

In various embodiments, each of the storage units operates as a distributed storage and task (DST) execution unit, and is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. Hereafter, a storage unit may be interchangeably referred to as a dispersed storage and task (DST) execution unit and a set of storage units may be interchangeably referred to as a set of DST execution units.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each managing unit 18 and the integrity processing unit 20 may be separate computing devices, may be a common computing device, and/or may be integrated into one or more of the computing devices 12-16 and/or into one or more of the storage units 36. In various embodiments, computing devices 12-16 can include user devices and/or can be utilized by a requesting entity generating access requests, which can include requests to read or write data to storage units in the DSN.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an 10 interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. Here, the computing device stores data object 40, which can include a file (e.g., text, video, audio, etc.), or other data arrangement. The dispersed storage error encoding parameters include an encoding function (e.g., information dispersal algorithm (IDA), Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides data object 40 into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
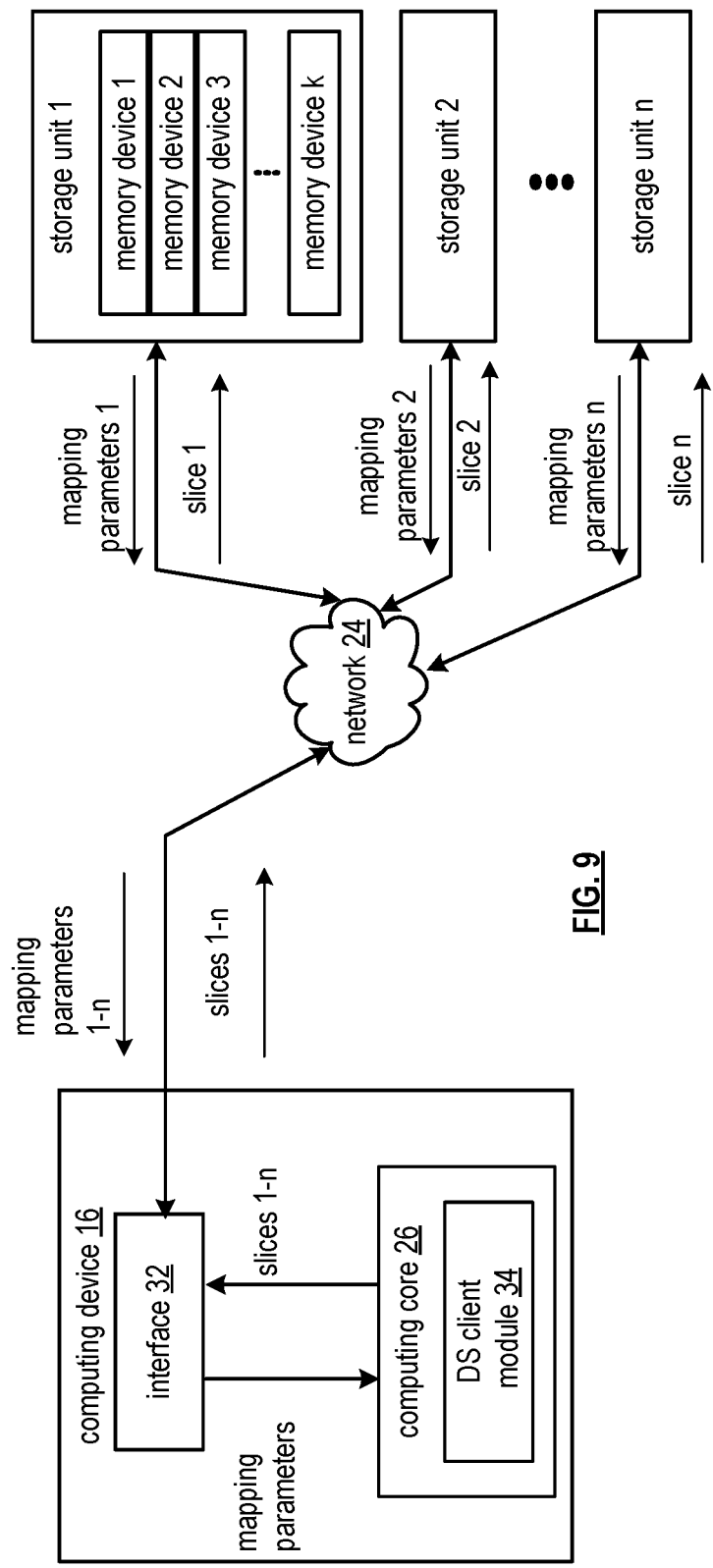
FIG. 9 is a schematic block diagram of an embodiment of a dispersed or distributed storage network (DSN) in accordance with the present invention.

FIG. 9 is a schematic block diagram of another embodiment of a dispersed storage network (DSN) that includes a computing device 16 of FIG. 1, the network 24 of FIG. 1, and a plurality of storage units 1-$n$. The computing device 16 can include the interface 32 of FIG. 1, the computing core 26 of FIG. 1, and the DS client module 34 of FIG. 1. The computing device 16 can function as a dispersed storage processing agent for computing device 14 as described previously, and may hereafter be interchangeably referred to as a distributed storage and task (DST) processing unit. Each storage unit may be implemented utilizing the storage unit 36 of FIG. 1, and can include a plurality of memory devices 1-$k$. Each storage unit can include the same number or a different number of memory devices. The DSN functions to allocate data based on memory device performance.

In various embodiments, a DST processing unit, when storing, listing, retrieving, or otherwise accessing slices from at least one storage unit, may benefit from knowledge of the status of memory devices within those storage units. In particular, the DST processing unit can benefit from knowledge of which memory devices of a storage unit are underperforming, failing, impaired, being-rebuilt, etc. However, the DST processing unit needs knowledge of which namespace ranges those memory devices are responsible for within each storage unit to determine which possible slice names of encoded slices correspond to storage locations within those memory devices. With this knowledge, the DST processing unit may prefer to avoid sending access requests to those storage units that have an impaired memory device responsible for storage of the data slice in question. The information regarding which memory devices are responsible for which namespace ranges can be small when each memory device is responsible for only a single fixed range of the namespace, and this information can be communicated efficiently to the DST processing unit as a response to a "memory device map request." However, certain mapping strategies may result in a very large number of namespace ranges being assigned to each memory device. This may occur, for example, when a storage unit uses a Decentralized Agreement Protocol (DAP) depicted in FIG. 11 to map potentially thousands of sub-ranges (or more), to individual memory devices in accordance with the capacity of each memory device. The advantage of this strategy is that when any memory device fails or gives up its assigned namespace ranges, the many hundreds or thousands of sub-ranges can be more or less equally redistributed across all surviving memory devices, rather than just to neighbors (which is required when keeping the namespace range to memory device ration 1:1). However, the many disks, and their thousands of sub-ranges represents a large degree of information, which is inefficient to communicate as a response to a "memory device map request".

As an alternative, a DST processing unit, rebuild module, or other requester can send a "mapping parameters request" to the storage unit. The storage unit can then return the parameters it uses to generate its own namespace range to memory device map. These mapping parameters can include memory device capacities, memory device identifiers, an algorithm name (e.g. what Decentralized Agreement Protocol deterministic function to use), the number of namespace range subdivisions. From this information, the DST processing unit can re-execute the same algorithm the storage unit executed to derive its mapping of namespace ranges to memory devices, and thereby know which slice names are mapped to which memory devices. Furthermore, with the health information of the memory devices, the DST processing unit can know which slice names to avoid (due to potentially missing or suffering performance issues), rebuild modules can more efficiently focus on scanning ranges impacted by a failing memory device, and/or orchestration processes (such as an upgrade process which must ensure vault health) can avoid simultaneously bringing down combinations of ds units which would result in ranges being inaccessible for reads or writes (due to internal memory device errors on ds units not brought down by the orchestration process).

The DST processing unit can receive these health statuses via system registry information and/or a lookup table, and/or can receive the health statuses from the corresponding storage unit(s). In various embodiments, the health statuses can be received along with the mapping parameters. In other embodiments, the health statuses can be received at a predetermined time interval. The health status can include raw data or be a calculated value based on one or more factors, such as performance, storage limits, past history of accesses, unresponsiveness, latency, device capabilities, memory and/or errors, etc. In various embodiments, the health status of each memory device of a storage unit can be compared to a health status threshold, and a set of slice name subsets corresponding to one or more ranges of the namespace corresponding to memory devices with health statuses that compare favorably to the health status threshold can be determined. In various embodiments, when writing a slice of a data object, the slice name of the data object can be selected from this set of slice name subsets. In various embodiments, generating a set of encoded slices of a data object will be based on the set of slice name subsets across all of the corresponding storage units that the encoded slices will be distributed amongst. For example, the encoding function used to generate the encoded slices can take this information as a parameter, and as a result will only generate slices with slice name subsets.

In various embodiments, this method of reverse-engineering the namespace of a storage unit can be used to reallocate data in a single storage unit, or to reallocate data amongst multiple storage units. For example, the DST processing unit may request the mapping parameters and/or health statuses of memory devices from one or more storage units in response to a reallocation requirement, determine which slices are stored in low-health memory devices of one or more storage units, and reallocate them accordingly. In various embodiments, the slices to be reallocated can be based on a health status threshold as discussed previously, and slices of memory devices performing below the health status threshold will be reallocated. In various devices, a data object must have at least a fixed percentage of slices stored in "healthy" memory devices, and only encoded slices of data objects that fail to meet this requirement will be reallocated. In various embodiments, a reallocation maximum and/or minimum can be specified. For example, only a number of slices up to the reallocation maximum can be reallocated, and the slices to be reallocated can be selected based on comparing health status levels of various memory devices, targeting encoded slices of data objects with several slices in low-health memory devices, targeting storage units with several low-health memory devices, etc. In various at least a minimum number of slices can be reallocated, for example, based on similar factors. In various embodiments, the reallocation requirement will be received via the network, or can be determined by the DST processing unit itself, for example based on changes in memory device health, based on past accesses, and/or based on a failed access attempt. In various embodiments, the reallocation requirement can be for a single slice, a slices of a single data object, slices in a single memory device, slices across a single storage unit, or across several of these elements in a system. For example, the reallocation requirement can be determined in response to an access request. As part of performing the access, the DST processing unit can rebuild the namespace, evaluate the health status of the corresponding memory device, and determine if the slice in question needs to be moved to a new location. In various embodiments, upon determining that a slice needs to be moved, as part of generating a new slice name, the entire set of encoded slices of the data object is regenerated and are moved to new locations accordingly. In other embodiments, in response to identifying the low-health memory device during the access request, the reallocation requirement can include moving one, multiple, or all of the additional slices stored in the low-health memory device to new locations. In various embodiments, the DSP processing unit can generate notification to other elements of the DSN and/or a user of the DSN indicating low-health memory devices to be replaced.

In various embodiments, a processing system of a dispersed storage and task (DST) processing unit includes at least one processor and a memory that stores operational instructions, that when executed by the at least one processor cause the processing system to generate a first request for mapping parameters for transmission via a network to a first one of a plurality of storage units in a dispersed storage network (DSN) and to receive first mapping parameter data in response. First namespace mapping data that indicates a mapping of a plurality of possible slice names to a first plurality of memory devices of the first one of the plurality of storage units is generated by performing a first deterministic mapping function based on the first mapping parameter data. Slice name subset data indicating a subset of the plurality of possible slice names is generated based on a plurality of health status indicators corresponding to the first plurality of memory devices. A first slice name corresponding to a first encoded slice of a first data object is selected from the subset indicated by the slice name subset data. A first write request is generated for transmission via the network that includes the first encoded slice to the first one of the plurality of storage units.

In various embodiments, memory device status data is received from the one of the plurality of storage units via the network that includes the plurality of health status indicators. In various embodiments, the memory device status data is received from the one of the plurality of storage units in response to the first request for mapping parameters. In various embodiments, generating the slice name subset data includes comparing each of the plurality of health status indicators to a health status threshold, and wherein a one of the plurality of possible slice names is included in the subset when its corresponding health status indicator compares favorably to the health status threshold.

In various embodiments, the first deterministic mapping function is based on a Decentralized Agreement Protocol (DAP). In various embodiments, the first deterministic mapping function corresponds to a mapping algorithm utilized by the one of the plurality of storage units, and wherein the first encoded slice is stored in a one of the first plurality of memory devices of the one of the plurality of storage units based on performing the mapping algorithm on the first encoded slice. In various embodiments, the first deterministic mapping function is one of a plurality of deterministic mapping functions indicated by the first mapping parameter data.

In various embodiments, a plurality of selected slice names that includes the first slice name are selected, each corresponding to each of a plurality of encoded slices corresponding to the first data object based on the slice name subset data. A plurality of write requests that includes the first write request are generated, each for transmission via the network to a corresponding one of the plurality of storage units, wherein each of the plurality of write requests indicates a corresponding one of the plurality of encoded slices. The first request for mapping parameters is transmitted to the plurality of storage units and each of a plurality of mapping parameter data, which includes the first mapping parameter data, is received from each of the plurality of storage units. The first namespace mapping data indicates, for each of the plurality of storage units, the corresponding mapping of a plurality of possible slice names to the first plurality of memory devices of the each of the plurality of storage units. The slice name subset data indicates a plurality of subsets of the plurality of possible slice names for each of the plurality of storage units based on the plurality of health status indicators corresponding to the first plurality of memory devices corresponding to each of the plurality of storage units. In various embodiments, an encoding function is performed on the first data object based on the slice name subset data to generate the plurality of encoded slices. The corresponding plurality of selected slice names are also generated by the encoding function, and the each of the corresponding plurality of selected slice names are included in one of the plurality of subsets indicated by the slice name subset data.

In various embodiments, an access request is received from a requesting entity via the network indicating a second encoded slice stored in the DSN. A second request for mapping parameters are generated for transmission via a network to a second one of a plurality of storage units in a dispersed storage network (DSN) and receiving second mapping parameter data in response. Slice location data is generated that indicates a one of a second plurality of memory devices of the second one of the plurality of storage units corresponding to a location where the second encoded slice is stored by performing a second deterministic mapping function on a second slice name corresponding to the second encoded slice based on the second mapping parameter data. The access request is performed when a health status indicator corresponding to the second one of the second plurality of memory devices compares favorably to a health status threshold. In various embodiments, a low-health notification is generated for transmission to the requesting entity via the network indicating that the access request will not be performed when the health status indicator corresponding to the second one of the second plurality of memory devices compares unfavorably to the health status threshold. The DST processing unit foregoes the access request in this case.

In various embodiments, the first request for mapping parameters is generated in response to a slice reallocation requirement. Reallocation data is generated in response to the slice name subset data indicating that an original slice name of the first encoded slice is not included in the subset. The reallocation data indicates a new slice name to replace the original slice name of the first encoded slice. The first write request indicates the original slice name and a request to remove the first encoded slice from a memory device corresponding to old slice name. In various embodiments, the slice reallocation requirement is received via the network. In various embodiments, the slice reallocation requirement is based on a predetermined time interval elapsing. In various embodiments, the slice reallocation requirement is based on performance data from past access to the plurality of storage units. In various embodiments, a request for memory device status data from the first one of the plurality of storage units is transmitted via the network in response to the slice reallocation requirement. A plurality of health status indicators are received via the network in response to the request for memory device status data.

In various embodiments, reallocation data is generated in response to the size of the subset indicated by the slice name subset data comparing unfavorably to a required healthy memory device count. The reallocation data indicates a plurality of encoded slices stored in the one of the plurality of storage units, each with a corresponding original slice name that is not included in the subset indicated by the slice name subset data. The reallocation data further indicates a plurality of new slice names, each included in the subset indicated by the slice name subset data, and each of the plurality of encoded slices is assigned a corresponding one of the plurality of new slice names. A second plurality of write requests are generated, each for transmission via the network to the plurality of storage units. Each of the plurality of write requests indicates that a corresponding one of the plurality of encoded slices be moved from an old one of the first plurality of memory devices corresponding to the original slice name to a new one of the first plurality of memory devices corresponding to the new slice name. In various embodiments, each of the plurality of new slice names are determined based on performing an encoding function on one of a plurality of data objects of the corresponding one of the plurality of encoded slices based on the slice name subset data.

Figure 10:
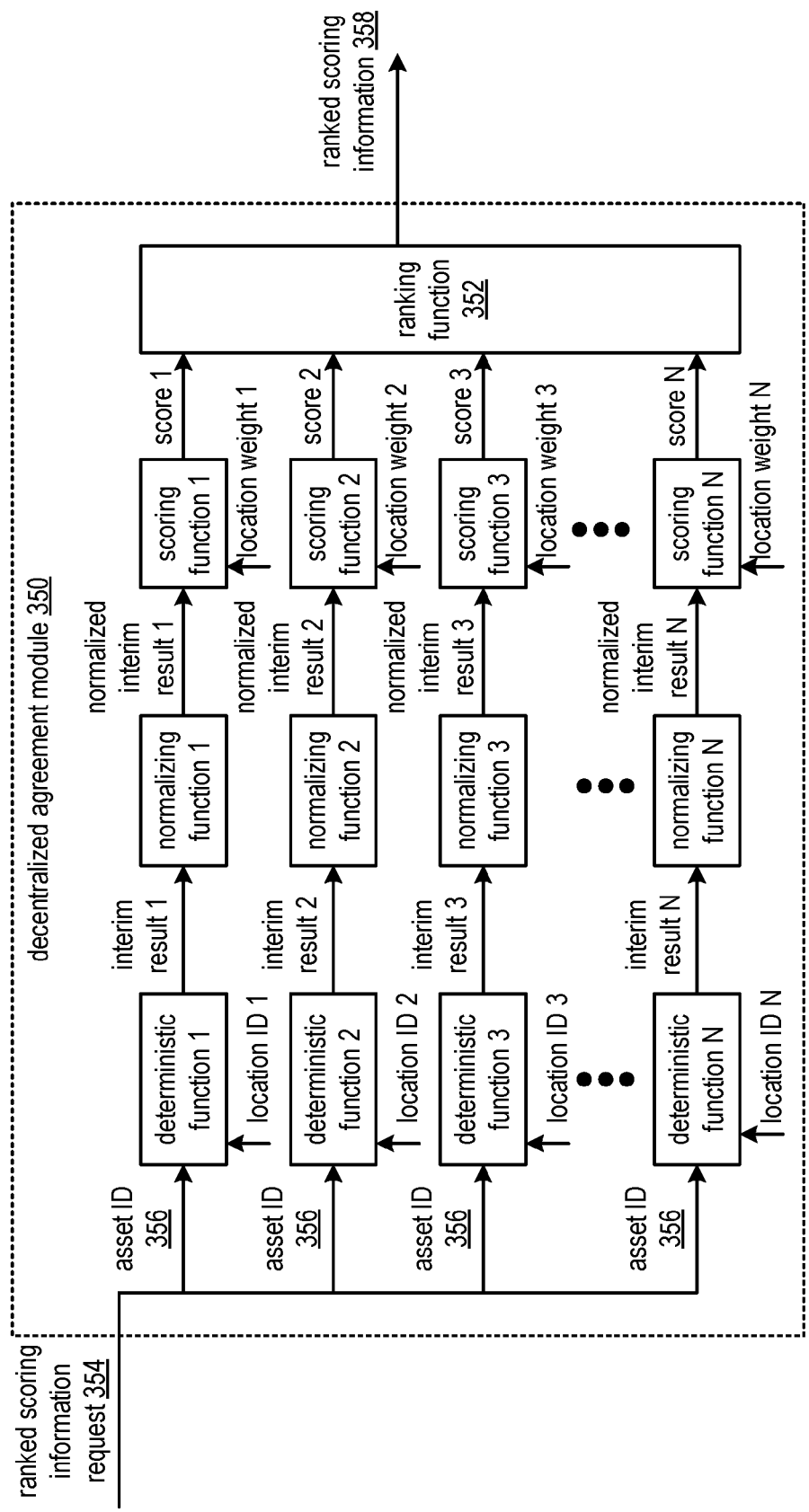
FIG. 10 is a schematic block diagram of an embodiment of a decentralized agreement module in accordance with the present invention.

FIG. 10 is a schematic block diagram of an embodiment of a decentralized agreement module 350 that includes a set of deterministic functions 1-N, a set of normalizing functions 1-N, a set of scoring functions 1-N, and a ranking function 352. Each of the deterministic function, the normalizing function, the scoring function, and the ranking function 352, may be implemented utilizing the computing core 26 of FIG. 2. The decentralized agreement module 350 may be implemented utilizing any module and/or unit of a dispersed storage network (DSN). For example, the decentralized agreement module is implemented utilizing the distributed storage and task (DST) client module 34 of FIG. 1. In various embodiments, data will be allocated amongst memory devices of a storage unit as described previously by utilizing the decentralized agreement module.

The decentralized agreement module 350 functions to receive a ranked scoring information request 354 and to generate ranked scoring information 358 based on the ranked scoring information request 354 and other information. The ranked scoring information request 354 includes one or more of an asset identifier (ID) 356 of an asset associated with the request, an asset type indicator, one or more location identifiers of locations associated with the DSN, one or more corresponding location weights, and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID 356 of the asset includes one or more of a data name, a data record identifier, a source name, a slice name, and a plurality of sets of slice names.

Each location of the DSN includes an aspect of a DSN resource. Examples of locations includes one or more of a storage unit, a memory device of the storage unit, a site, a storage pool of storage units, a pillar index associated with each encoded data slice of a set of encoded data slices generated by an information dispersal algorithm (IDA), a DS client module 34 of FIG. 1, a computing device 12-16 of FIG. 1, an integrity unit 20 of FIG. 1, and a managing unit 18 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others. The other information may include a set of location identifiers and a set of location weights associated with the set of location identifiers. For example, the other information includes location identifiers and location weights associated with a set of memory devices of a storage unit when the requesting entity utilizes the decentralized agreement module 350 to produce ranked scoring information 358 with regards to selection of a memory device of the set of memory devices for accessing a particular encoded data slice (e.g., where the asset ID includes a slice name of the particular encoded data slice).

The decentralized agreement module 350 outputs substantially identical ranked scoring information for each ranked scoring information request that includes substantially identical content of the ranked scoring information request. For example, a first requesting entity issues a first ranked scoring information request to the decentralized agreement module 350 and receives first ranked scoring information. A second requesting entity issues a second ranked scoring information request to the decentralized agreement module and receives second ranked scoring information. The second ranked scoring information is substantially the same as the first ranked scoring information when the second ranked scoring information request is substantially the same as the first ranked scoring information request.

As such, two or more requesting entities may utilize the decentralized agreement module 350 to determine substantially identical ranked scoring information. As a specific example, the first requesting entity selects a first storage pool of a plurality of storage pools for storing a set of encoded data slices utilizing the decentralized agreement module 350 and the second requesting entity identifies the first storage pool of the plurality of storage pools for retrieving the set of encoded data slices utilizing the decentralized agreement module 350.

In an example of operation, the decentralized agreement module 350 receives the ranked scoring information request 354. Each deterministic function performs a deterministic function on a combination and/or concatenation (e.g., add, append, interleave) of the asset ID 356 of the ranked scoring information request 354 and an associated location ID of the set of location IDs to produce an interim result. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 2 appends a location ID 2 of a storage pool 2 to a source name as the asset ID to produce a combined value and performs the mask generating function on the combined value to produce interim result 2.

With a set of interim results 1-N, each normalizing function performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 2 performs the normalizing function on the interim result 2 to produce a normalized interim result 2.

With a set of normalized interim results 1-N, each scoring function performs a scoring function on a corresponding normalized interim result to produce a corresponding score. The performing of the scoring function includes dividing an associated location weight by a negative log of the normalized interim result. For example, scoring function 2 divides location weight 2 of the storage pool 2 (e.g., associated with location ID 2) by a negative log of the normalized interim result 2 to produce a score 2.

With a set of scores 1-N, the ranking function 352 performs a ranking function on the set of scores 1-N to generate the ranked scoring information 358. The ranking function includes rank ordering each score with other scores of the set of scores 1-N, where a highest score is ranked first. As such, a location associated with the highest score may be considered a highest priority location for resource utilization (e.g., accessing, storing, retrieving, etc., the given asset of the request). Having generated the ranked scoring information 358, the decentralized agreement module 350 outputs the ranked scoring information 358 to the requesting entity.

Figure 11:
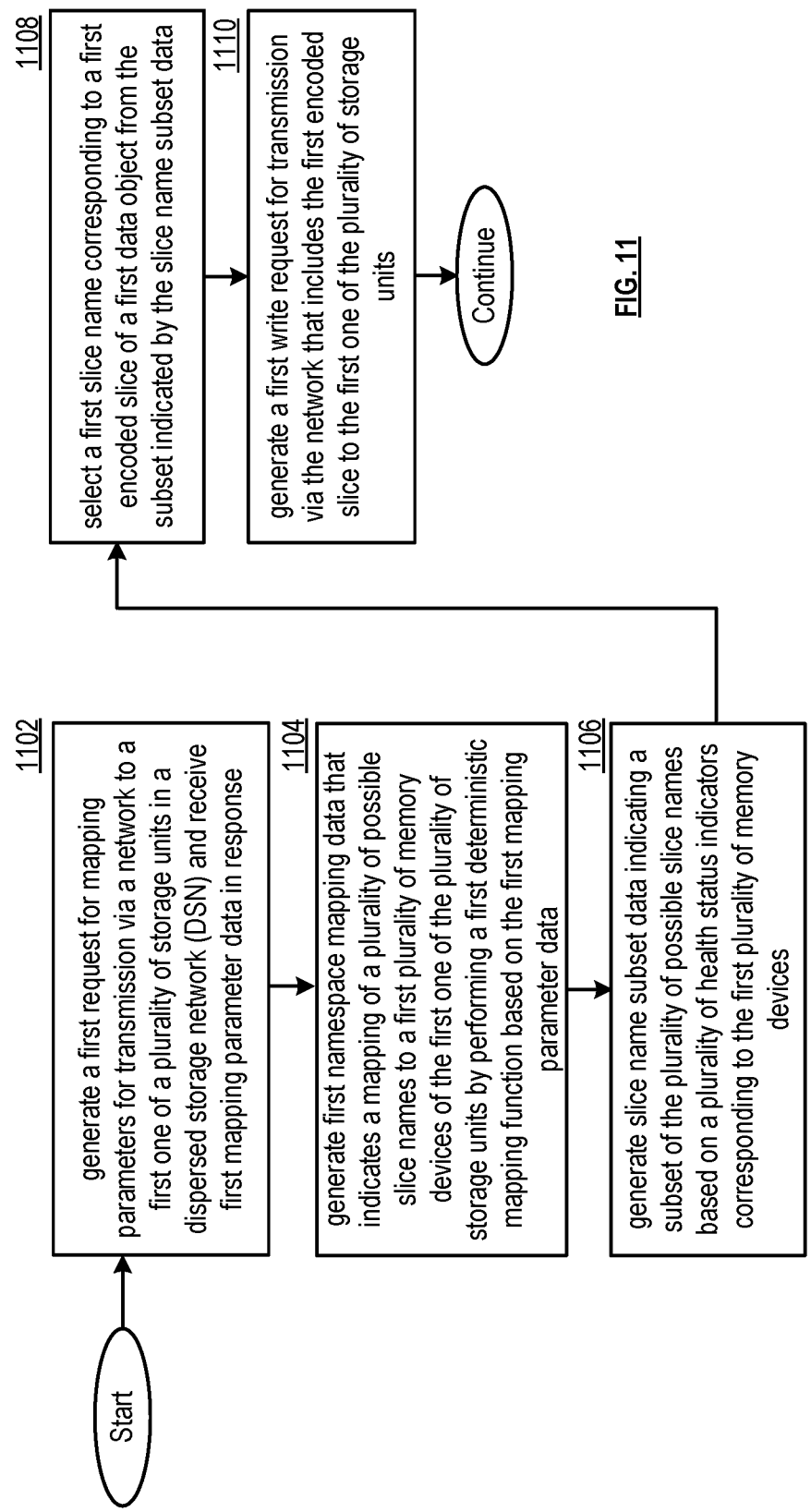
FIG. 11 is a logic diagram of an example of a method of allocating data based on memory device performance in accordance with the present invention.

FIG. 11 is a flowchart illustrating an example of allocating data based on memory device performance. In particular, a method is presented for use in association with one or more functions and features described in conjunction with FIGS. 1-10, for execution by a dispersed storage and task (DST) processing unit that includes a processor or via another processing system of a dispersed storage network that includes at least one processor and memory that stores instruction that configure the processor or processors to perform the steps described below. Step 1102 includes generating a first request for mapping parameters for transmission via a network to a first one of a plurality of storage units in a dispersed storage network (DSN) and receiving first mapping parameter data in response. Step 1104 includes generating first namespace mapping data that indicates a mapping of a plurality of possible slice names to a first plurality of memory devices of the first one of the plurality of storage units by performing a first deterministic mapping function based on the first mapping parameter data. Step 1106 includes generating slice name subset data indicating a subset of the plurality of possible slice names based on a plurality of health status indicators corresponding to the first plurality of memory devices. Step 1108 includes selecting a first slice name corresponding to a first encoded slice of a first data object from the subset indicated by the slice name subset data. Step 1110 includes generating a first write request for transmission via the network that includes the first encoded slice to the first one of the plurality of storage units.

In various embodiments, memory device status data is received from the one of the plurality of storage units via the network that includes the plurality of health status indicators. In various embodiments, the memory device status data is received from the one of the plurality of storage units in response to the first request for mapping parameters. In various embodiments, generating the slice name subset data includes comparing each of the plurality of health status indicators to a health status threshold, and wherein a one of the plurality of possible slice names is included in the subset when its corresponding health status indicator compares favorably to the health status threshold.

In various embodiments, the first deterministic mapping function is based on a Decentralized Agreement Protocol (DAP). In various embodiments, the first deterministic mapping function corresponds to a mapping algorithm utilized by the one of the plurality of storage units, and wherein the first encoded slice is stored in a one of the first plurality of memory devices of the one of the plurality of storage units based on performing the mapping algorithm on the first encoded slice. In various embodiments, the first deterministic mapping function is one of a plurality of deterministic mapping functions indicated by the first mapping parameter data.

In various embodiments, a plurality of selected slice names that includes the first slice name are selected, each corresponding to each of a plurality of encoded slices corresponding to the first data object based on the slice name subset data. A plurality of write requests that includes the first write request are generated, each for transmission via the network to a corresponding one of the plurality of storage units, wherein each of the plurality of write requests indicates a corresponding one of the plurality of encoded slices. The first request for mapping parameters is transmitted to the plurality of storage units and each of a plurality of mapping parameter data, which includes the first mapping parameter data, is received from each of the plurality of storage units. The first namespace mapping data indicates, for each of the plurality of storage units, the corresponding mapping of a plurality of possible slice names to the first plurality of memory devices of the each of the plurality of storage units. The slice name subset data indicates a plurality of subsets of the plurality of possible slice names for each of the plurality of storage units based on the plurality of health status indicators corresponding to the first plurality of memory devices corresponding to each of the plurality of storage units. In various embodiments, an encoding function is performed on the first data object based on the slice name subset data to generate the plurality of encoded slices. The corresponding plurality of selected slice names are also generated by the encoding function, and the each of the corresponding plurality of selected slice names are included in one of the plurality of subsets indicated by the slice name subset data.

In various embodiments, an access request is received from a requesting entity via the network indicating a second encoded slice stored in the DSN. A second request for mapping parameters are generated for transmission via a network to a second one of a plurality of storage units in a dispersed storage network (DSN) and receiving second mapping parameter data in response. Slice location data is generated that indicates a one of a second plurality of memory devices of the second one of the plurality of storage units corresponding to a location where the second encoded slice is stored by performing a second deterministic mapping function on a second slice name corresponding to the second encoded slice based on the second mapping parameter data. The access request is performed when a health status indicator corresponding to the second one of the second plurality of memory devices compares favorably to a health status threshold. In various embodiments, a low-health notification is generated for transmission to the requesting entity via the network indicating that the access request will not be performed when the health status indicator corresponding to the second one of the second plurality of memory devices compares unfavorably to the health status threshold. The DST processing unit foregoes the access request in this case.

In various embodiments, the first request for mapping parameters is generated in response to a slice reallocation requirement. Reallocation data is generated in response to the slice name subset data indicating that an original slice name of the first encoded slice is not included in the subset. The reallocation data indicates a new slice name to replace the original slice name of the first encoded slice. The first write request indicates the original slice name and a request to remove the first encoded slice from a memory device corresponding to old slice name. In various embodiments, the slice reallocation requirement is received via the network. In various embodiments, the slice reallocation requirement is based on a predetermined time interval elapsing. In various embodiments, the slice reallocation requirement is based on performance data from past access to the plurality of storage units. In various embodiments, a request for memory device status data from the first one of the plurality of storage units is transmitted via the network in response to the slice reallocation requirement. A plurality of health status indicators are received via the network in response to the request for memory device status data.

In various embodiments, reallocation data is generated in response to the size of the subset indicated by the slice name subset data comparing unfavorably to a required healthy memory device count. The reallocation data indicates a plurality of encoded slices stored in the one of the plurality of storage units, each with a corresponding original slice name that is not included in the subset indicated by the slice name subset data. The reallocation data further indicates a plurality of new slice names, each included in the subset indicated by the slice name subset data, and each of the plurality of encoded slices is assigned a corresponding one of the plurality of new slice names. A second plurality of write requests are generated, each for transmission via the network to the plurality of storage units. Each of the plurality of write requests indicates that a corresponding one of the plurality of encoded slices be moved from an old one of the first plurality of memory devices corresponding to the original slice name to a new one of the first plurality of memory devices corresponding to the new slice name. In various embodiments, each of the plurality of new slice names are determined based on performing an encoding function on one of a plurality of data objects of the corresponding one of the plurality of encoded slices based on the slice name subset data.

In various embodiments, a non-transitory computer readable storage medium includes at least one memory section that stores operational instructions that, when executed by a processing system of a dispersed storage network (DSN) that includes a processor and a memory, causes the processing system to generate a first request for mapping parameters for transmission via a network to a first one of a plurality of storage units in the DSN and to receive a first mapping parameter data in response. First namespace mapping data that indicates a mapping of a plurality of possible slice names to a first plurality of memory devices of the first one of the plurality of storage units is generated by performing a first deterministic mapping function based on the first mapping parameter data. Slice name subset data indicating a subset of the plurality of possible slice names is generated based on a plurality of health status indicators corresponding to the first plurality of memory devices. A first slice name corresponding to a first encoded slice of a first data object is selected from the subset indicated by the slice name subset data. A first write request is generated for transmission via the network that includes the first encoded slice to the first one of the plurality of storage units.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a computing device that includes a processor, the method comprises:
generating a first request for mapping parameters for transmission via a network to a first one of a plurality of storage units in a dispersed storage network (DSN) and receiving first mapping parameter data in response;
generating first namespace mapping data that indicates a mapping of a plurality of possible slice names to a first plurality of memory devices of the first one of the plurality of storage units by performing a first deterministic mapping function based on the first mapping parameter data;

generating slice name subset data indicating a subset of the plurality of possible slice names based on a plurality of health status indicators corresponding to the first plurality of memory devices;

selecting a first slice name corresponding to a first encoded slice of a first data object from the subset indicated by the slice name subset data; and generating a first write request for transmission via the network that includes the first encoded slice to the first one of the plurality of storage units.

2. The method of claim 1, further comprising receiving memory device status data from the one of the plurality of storage units via the network that includes the plurality of health status indicators.

3. The method of claim 2, wherein the memory device status data is received from the one of the plurality of storage units in response to the first request for mapping parameters.

4. The method of claim 1, wherein generating the slice name subset data includes comparing each of the plurality of health status indicators to a health status threshold, and wherein a one of the plurality of possible slice names is included in the subset when its corresponding health status indicator compares favorably to the health status threshold.

5. The method of claim 1, wherein the first deterministic mapping function is based on a Decentralized Agreement Protocol (DAP).

6. The method of claim 1, wherein the first deterministic mapping function corresponds to a mapping algorithm utilized by the one of the plurality of storage units, and wherein the first encoded slice is stored in a one of the first plurality of memory devices of the one of the plurality of storage units based on performing the mapping algorithm on the first encoded slice.

7. The method of claim 1, further comprising:
selecting a plurality of selected slice names that includes the first slice name, each corresponding to each of a plurality of encoded slices corresponding to the first data object based on the slice name subset data; and generating a plurality of write requests that includes the first write request, each for transmission via the network to a corresponding one of the plurality of storage units, wherein each of the plurality of write requests indicates a corresponding one of the plurality of encoded slices;

wherein the first request for mapping parameters is transmitted to the plurality of storage units and each of a plurality of mapping parameter data, which includes the first mapping parameter data, is received from each of the plurality of storage units;

wherein the first namespace mapping data indicates, for each of the plurality of storage units, the corresponding mapping of a plurality of possible slice names to the first plurality of memory devices of the each of the plurality of storage units; and wherein the slice name subset data indicates a plurality of subsets of the plurality of possible slice names for each of the plurality of storage units based on the plurality of health status indicators corresponding to the first plurality of memory devices corresponding to each of the plurality of storage units.

8. The method of claim 7, further comprising performing an encoding function on the first data object based on the slice name subset data to generate the plurality of encoded slices, wherein the corresponding plurality of selected slice names are also generated by the encoding function, and wherein the each of the corresponding plurality of selected slice names are included in one of the plurality of subsets indicated by the slice name subset data.

9. The method of claim 1, wherein the first deterministic mapping function is one of a plurality of deterministic mapping functions indicated by the first mapping parameter data.

10. The method of claim 1, further comprising:
receiving an access request from a requesting entity via the network indicating a second encoded slice stored in the DSN;

generating a second request for mapping parameters for transmission via a network to a second one of a plurality of storage units in the DSN and receiving second mapping parameter data in response;

generating slice location data that indicates a one of a second plurality of memory devices of the second one of the plurality of storage units corresponding to a location where the second encoded slice is stored by performing a second deterministic mapping function on a second slice name corresponding to the second encoded slice based on the second mapping parameter data; and performing the access request when a health status indicator corresponding to the second one of the second plurality of memory devices compares favorably to a health status threshold.

11. The method of claim 10, further comprising:
generating a low-health notification for transmission to the requesting entity via the network indicating that the access request will not be performed and foregoing the access request when the health status indicator corresponding to the second one of the second plurality of memory devices compares unfavorably to the health status threshold.

12. The method of claim 1, wherein the first request for mapping parameters is generated in response to a slice reallocation requirement, further comprising:
generating reallocation data in response to the slice name subset data indicating that an original slice name of the first encoded slice is not included in the subset, wherein the reallocation data indicates a new slice name to replace the original slice name of the first encoded slice, wherein the first write request indicates the original slice name and a request to remove the first encoded slice from a memory device corresponding to old slice name.

13. The method of claim 12, wherein the slice reallocation requirement is received via the network.

14. The method of claim 12, wherein the slice reallocation requirement is based on a predetermined time interval elapsing.

15. The method of claim 12, wherein the slice reallocation requirement is based on performance data from past access to the plurality of storage units.

16. The method of claim 12, further comprising:
transmitting a request for memory device status data from the first one of the plurality of storage units via the network in response to the slice reallocation requirement; and receiving plurality of health status indicators via the network in response to the request for memory device status data.

17. The method of claim 1, further comprising:
generating reallocation data in response to the size of the subset indicated by the slice name subset data comparing unfavorably to a required healthy memory device count, wherein the reallocation data indicates a plurality of encoded slices stored in the one of the plurality of storage units, each with a corresponding original slice name that is not included in the subset indicated by the slice name subset data, wherein the reallocation data further indicates a plurality of new slice names, each included in the subset indicated by the slice name subset data, and wherein each of the plurality of encoded slices is assigned a corresponding one of the plurality of new slice names; and generating a second plurality of write requests, each for transmission via the network to the plurality of storage units, wherein each of the plurality of write requests indicates that a corresponding one of the plurality of encoded slices be moved from an old one of the first plurality of memory devices corresponding to the original slice name to a new one of the first plurality of memory devices corresponding to the new slice name.

18. The method of claim 17, wherein each of the plurality of new slice names are determined based on performing an encoding function on one of a plurality of data objects of the corresponding one of the plurality of encoded slices based on the slice name subset data.

19. A processing system of a computing device comprises:

at least one processor;

a memory that stores operational instructions, that when executed by the at least one processor cause the processing system to:

generate a first request for mapping parameters for transmission via a network to a first one of a plurality of storage units in a dispersed storage network (DSN) and receiving first mapping parameter data in response;

generate first namespace mapping data that indicates a mapping of a plurality of possible slice names to a first plurality of memory devices of the first one of the plurality of storage units by performing a first deterministic mapping function based on the first mapping parameter data;

generate slice name subset data indicating a subset of the plurality of possible slice names based on a plurality of health status indicators corresponding to the first plurality of memory devices;

select a first slice name corresponding to a first encoded slice of a first data object from the subset indicated by the slice name subset data; and generate a first write request for transmission via the network that includes the first encoded slice to the first one of the plurality of storage units.

20. A non-transitory computer readable storage medium comprises:

at least one memory section that stores operational instructions that, when executed by a processing system of a dispersed storage network (DSN) that includes a processor and a memory, causes the processing system to:

generate a first request for mapping parameters for transmission via a network to a first one of a plurality of storage units in the DSN and receiving first mapping parameter data in response;

generate first namespace mapping data that indicates a mapping of a plurality of possible slice names to a first plurality of memory devices of the first one of the plurality of storage units by performing a first deterministic mapping function based on the first mapping parameter data;

generate slice name subset data indicating a subset of the plurality of possible slice names based on a plurality of health status indicators corresponding to the first plurality of memory devices;

select a first slice name corresponding to a first encoded slice of a first data object from the subset indicated by the slice name subset data; and generate a first write request for transmission via the network that includes the first encoded slice to the first one of the plurality of storage units.

* * * * *